US010184785B2

(12) United States Patent
Morioka et al.

(10) Patent No.: US 10,184,785 B2
(45) Date of Patent: Jan. 22, 2019

(54) MEASUREMENT METHOD AND OPTICAL RECEPTACLE

(71) Applicant: Enplas Corporation, Saitama (JP)

(72) Inventors: Shimpei Morioka, Saitama (JP); Yuki Saito, Saitama (JP); Tadanobu Niimi, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 15/539,337

(22) PCT Filed: Dec. 17, 2015

(86) PCT No.: PCT/JP2015/085298
§ 371 (c)(1),
(2) Date: Jun. 23, 2017

(87) PCT Pub. No.: WO2016/104302
PCT Pub. Date: Jun. 30, 2016

(65) Prior Publication Data
US 2017/0356738 A1 Dec. 14, 2017

(30) Foreign Application Priority Data
Dec. 25, 2014 (JP) .................. 2014-263393

(51) Int. Cl.
*G01B 11/26* (2006.01)
*G01B 11/06* (2006.01)
(Continued)

(52) U.S. Cl.
CPC .......... *G01B 11/0608* (2013.01); *G01B 11/26* (2013.01); *G02B 6/4214* (2013.01);
(Continued)

(58) Field of Classification Search
CPC ...... G02B 6/4214; G02B 6/4286; G02B 6/42; G02B 6/4204; G02B 6/4249;
(Continued)

(56) References Cited

U.S. PATENT DOCUMENTS

| 5,440,145 A * | 8/1995 | Cole ................. G01N 21/274 |
| | | 250/237 R |
| 6,711,186 B2 * | 3/2004 | Komeda ............ G02B 6/4214 |
| | | 372/29.02 |

(Continued)

FOREIGN PATENT DOCUMENTS

| JP | 7-4932 A | 1/1995 |
| JP | 2010/087391 A1 | 8/2010 |

(Continued)

OTHER PUBLICATIONS

International Search Report from International Application No. PCT/JP2015/085298 dated Feb. 16, 2016.

*Primary Examiner* — Isiaka Akanbi
(74) *Attorney, Agent, or Firm* — Brundidge & Stanger, P.C.

(57) ABSTRACT

Provided is an optical receptacle (140) having an installation plane (141), an optical plane, and a reference plane (147). An inclination angle of the reference plane (147) with respect to the installation plane (141) is smaller than an inclination angle of the optical plane with respect to the installation plane (141). Then, a first inclination angle θ1 that is the inclination angle of the reference plane (147) with respect to the installation plane (141) and a second inclination angle θ2 that is an inclination angle of the optical plane with respect to the reference plane (147) are measured. Then, the first inclination angle θ1 is added to the second inclination angle θ2 to calculate a third inclination angle θ3

(Continued)

that is the inclination angle of the optical plane with respect to the installation plane (141).

5 Claims, 10 Drawing Sheets

(51) Int. Cl.
  *H01L 31/0232* (2014.01)
  *G02B 6/42* (2006.01)
(52) U.S. Cl.
  CPC ......... *G02B 6/4246* (2013.01); *G02B 6/4286* (2013.01); *H01L 31/0232* (2013.01); *G02B 6/4292* (2013.01)
(58) Field of Classification Search
  CPC ................ G02B 6/4292; G02B 6/4246; G01B 11/0608; G01B 11/26; H01L 31/0232
  USPC ................................. 356/138, 400, 618, 438
  See application file for complete search history.

(56) References Cited

U.S. PATENT DOCUMENTS

| | | | |
|---|---|---|---|
| 9,052,478 B2* | 6/2015 | Charbonneau-Lefort | .................. G02B 6/32 |
| 2005/0147353 A1 | 7/2005 | Vancoill et al. | |
| 2011/0279826 A1 | 11/2011 | Miura et al. | |
| 2012/0008899 A1* | 1/2012 | Morioka | .............. G02B 6/4214 385/33 |
| 2013/0266260 A1* | 10/2013 | Morioka | .............. G02B 6/4214 385/33 |
| 2014/0133802 A1 | 5/2014 | Morioka | |
| 2014/0328558 A1* | 11/2014 | Morioka | .............. G02B 6/4286 385/33 |

FOREIGN PATENT DOCUMENTS

| | | |
|---|---|---|
| JP | 2012-194372 A | 10/2012 |
| JP | 2013-024918 | 2/2013 |

\* cited by examiner

MEASUREMENT METHOD AND OPTICAL RECEPTACLE

TECHNICAL FIELD

The present invention relates to a method for measuring an inclination angle of an optical flat surface relative to an installation flat surface in an optical receptacle, and an optical receptacle having an optical flat surface whose inclination angle can be measured by the measuring method.

BACKGROUND ART

Conventionally, in optical communications using an optical transmission member such as an optical fiber and an optical waveguide, optical modules including a light emitting element such as a surface-emitting laser (for example, a vertical cavity surface emitting laser (VCSEL)) have been used. Such optical modules include an optical receptacle that allows light which is emitted from a light emitting element and includes communication information to be incident on the end surface of an optical transmission member.

Some of the optical modules have a detecting element for monitoring the intensity or quantity of light emitted from a light emitting element, for the purpose of stabilization of output characteristics of the light emitting element or adjustment of optical output under temperature change (see, PTL 1).

PTL 1 describes an optical module which has a photoelectric conversion device including a light emitting element and a detecting element (light receiving element), and an optical receptacle optically connecting the light emitting element and the end surface of the optical transmission member (optical fiber). Further, the optical receptacle described in PTL 1 has a first surface on which light emitted from the light emitting element is incident and which emits monitor light toward the light receiving element, a first reflection surface which reflects the light emitted from the light emitting element and incident on the first surface, a light separation part which separate the light reflected on the first surface into monitor light travelling toward the first surface and light (signal light) to be coupled with the end surface of the optical fiber, and second surface which emits the light separated at the light separation part toward the end surface of the optical fiber.

In the optical module described in PTL 1, light which is emitted from the light emitting element and incident on the first surface is reflected on the first reflection surface to propagate toward the light separation part. The light which reaches the light separation part is separated thereat into signal light and monitor light. The monitor light is emitted from the first surface toward the light receiving surface of the light receiving element. The signal light is emitted from the second surface toward the light receiving surface of the optical fiber.

In an optical receptacle, an optical flat surface which transmits or reflects light affects sending and receiving of light, and therefore, it is necessary to control and measure the inclination angle of the optical flat surface with high accuracy. As a method for measuring an inclination angle of an optical flat surface of an optical receptacle with high accuracy, a method is known, by which the shape of a measuring object is measured in a noncontact manner using a laser probe (see, e.g., PTL 2).

PTL 2 describes a method and device for measuring the shape of a measuring object using a stage scanning type laser probe. The measuring device described in PTL 2 includes a laser light emitting unit, an objective lens, a focusing unit, a sensor, an auto focus (AF) scale, an X-stage and a Y-stage. A measuring object (a work to be measured) is disposed on the X-stage disposed on the Y-stage. The measuring object is then irradiated with laser light using the laser light emitting unit via the objective lens. Subsequently, reflected light which is reflected on the measuring object and transmitted through the objective lens again forms an image on the sensor. At this time, when focus is not on, the focusing unit moves the objective lens in the Z axis direction thereof to a focus point. The AF scale then detects the position (movement amount) of the objective lens. The shape of the measuring object can be measured based on the XYZ coordinate values of each detected point.

CITATION LIST

Patent Literature

PTL 1
Japanese Patent Application Laid-Open No. 2013-24918
PTL 2
WO2010/087391

SUMMARY OF INVENTION

Technical Problem

As described above, the measuring method described in PTL 2 cannot perform measurement unless light reflected on a measuring object is transmitted through the objective lens again and reach the sensor. In a case where an inclination angle of an optical flat surface in an optical receptacle is measured, and the inclination angle of the optical flat surface is larger than a predetermined angle, light reflected on the optical flat surface does not appropriately return to the sensor. As a result, measurement accuracy may become lowered or even the measurement may become impossible.

An object of the present invention is to provide a method for measuring an inclination angle of an optical flat surface relative to an installation flat surface in an optical receptacle, in a noncontact manner using a laser probe, by which the inclination angle of the optical flat surface can be measured with high accuracy even when the inclination angle of the optical flat surface relative to the installation flat surface is large. Another object of the present invention is to provide an optical receptacle having an optical flat surface whose inclination angle can be measured by the measuring method.

Solution to Problem

A measuring method according to the present invention is a method for measuring an inclination angle of an optical flat surface relative to an installation flat surface in an optical receptacle in a noncontact manner using a laser probe, including: providing an optical receptacle which includes an installation flat surface, an optical flat surface and a reference flat surface having an inclination angle relative to the installation flat surface, the inclination angle being smaller than an inclination angle of the optical flat surface relative to the installation flat surface; measuring a first inclination angle that is the inclination angle of the reference flat surface relative to the installation flat surface; measuring a second inclination angle that is an inclination angle of the optical flat surface relative to the reference flat surface; and calculating a third inclination angle that is the inclination angle of the optical flat surface relative to the installation flat surface, by adding the first inclination angle and the second inclination angle.

An optical receptacle according to the present invention is an optical receptacle to be installed between a photoelectric conversion device including a substrate and one or more photoelectric conversion elements disposed on the substrate, and one or more optical transmission members, the optical receptacle being configured to optically couple the photoelectric conversion element and an end surface of the optical transmission member, the optical receptacle including: an installation flat surface that is a surface contacting the substrate of the photoelectric conversion device when the optical receptacle is installed on the substrate; one or more first optical surfaces each configured to allow light emitted from the photoelectric conversion element to be incident thereon; or each configured to emit, toward the photoelectric conversion element, light emitted from the end surface of the optical transmission member and traveling inside the optical receptacle; one or more second optical surfaces each configured to emit the light incident on the first optical surface toward the end surface of the optical transmission member; or each configured to allow the light emitted from the end surface of the optical transmission member to be incident thereon; an optical flat surface which is disposed on an optical path between the first optical surface and the second optical surface and inclined at an angle larger than 40° relative to the installation flat surface, and which is configured to transmit or reflect at least a part of the light incident on the first optical surface toward the second optical surface, or to transmit or reflect at least a part of the light incident on the second optical surface toward the first optical surface; and a reference flat surface which is disposed at a position not on any optical path in the optical receptacle, and which has an inclination angle relative to the installation flat surface, the inclination angle being smaller than an inclination angle of the optical flat surface relative to the installation flat surface.

Advantageous Effects of Invention

According to the present invention, an inclination angle of an optical flat surface can be measured with high accuracy even when the inclination angle of the optical flat surface relative to an installation flat surface is large. Therefore, according to the present invention, the degree of freedom of optical design for optical receptacles becomes higher, and it becomes possible to design and produce more complicated optical products with high accuracy. Further, an inclination angle of an optical flat surface can be measured with higher accuracy using a conventional measuring device, and thus increase in measurement cost and production cost can be suppressed.

DESCRIPTION OF EMBODIMENTS

Hereinafter, an embodiment of the present invention will be described in detail with reference to the accompanying drawings.

(Configuration of Optical Module)

Figure 1A:
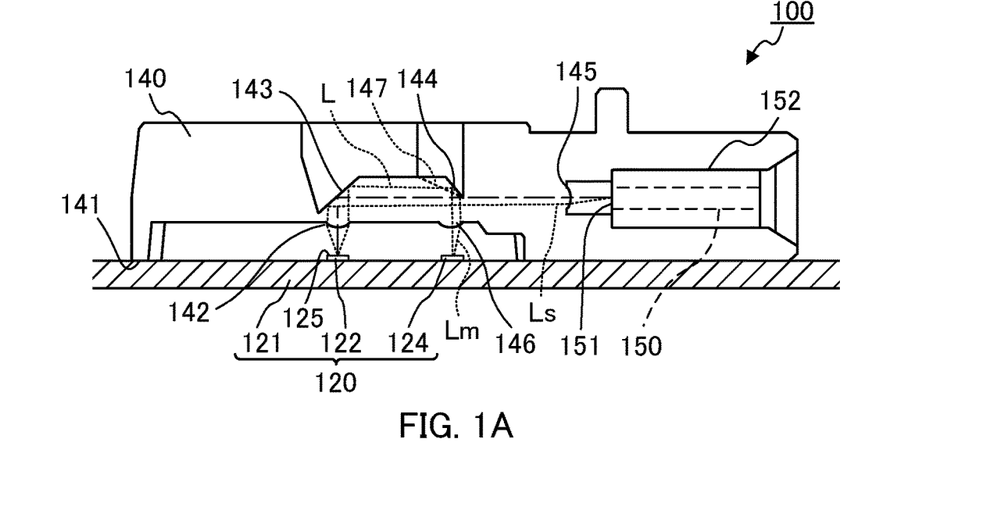
FIGS. 1A and 1B are sectional views of an optical module.
Figure 1B:
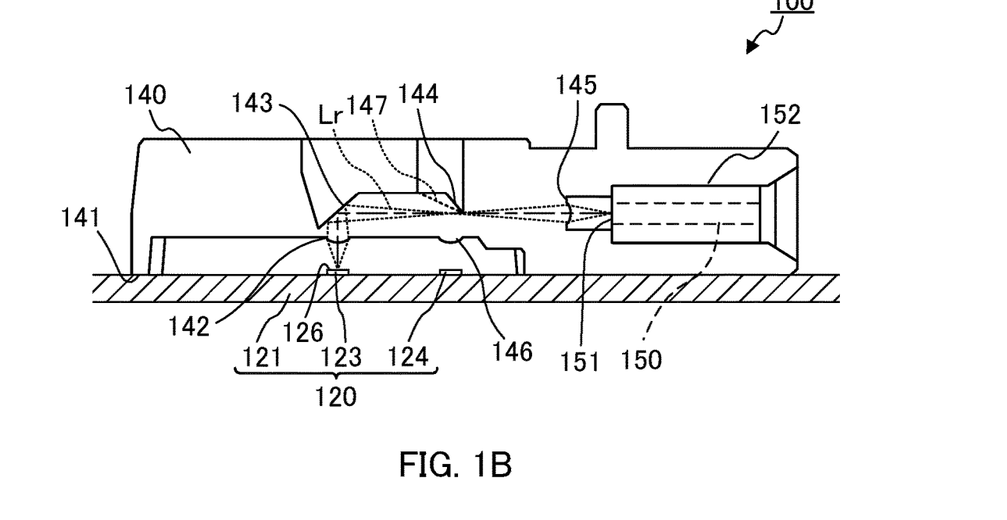

FIGS. 1A and 1B are sectional views of optical modules 100. FIG. 1A illustrates optical paths in optical module 100 for sending, and FIG. 1B illustrates optical paths in optical module 100 for receiving. In FIG. 1A and FIG. 1B, the hatching in the cross sections of optical receptacles 140 is omitted to illustrate optical paths in optical receptacles 140.

As illustrated in FIG. 1A and FIG. 1B, optical module 100 includes photoelectric conversion device 120 including substrate 121 and a photoelectric conversion element (light emitting element 122 or light receiving element 123), and optical receptacle 140. Optical module 100 is used in a state where optical transmission member 150 is connected to optical receptacle 140 via ferrule 152.

Photoelectric conversion device 120 includes substrate 121, light emitting element 122 or light receiving element 123, and detecting element 124. In optical module 100 for sending, light emitting element 122 is used as the photoelectric conversion element. In optical module 100 for receiving, light receiving element 123 is used as the photoelectric conversion element. Substrate 121 is, for example, a glass composite substrate, a glass epoxy substrate or a flexible substrate. Light emitting element 122 or light receiving element 123, and (below-described) detecting element 124 are disposed on substrate 121.

Light emitting element 122 is disposed on substrate 121, and is configured to emit laser light in a direction perpendicular to the installation part of substrate 121 where light emitting element 122 is disposed. The number of light emitting elements 122 is not limited. In the present embodiment, the number of light emitting elements 122 is one. The position of light emitting element 122 is not limited, either. Light emitting element 122 is, e.g., a vertical cavity surface emitting laser (VCSEL).

Light receiving element 123 is disposed on substrate 121 and is configured to receive reception light Lr from end surface 151 of optical transmission member 150. The number of light receiving elements 123 is not limited. In the present embodiment, the number of light receiving elements 123 is one. The position of light receiving element 123 is not limited, either. Light receiving element 123 is, e.g., a photodetector.

Detecting element 124 is configured to receive monitor light Lm for monitoring the output of emission light L (e.g., the intensity or quantity of the light) emitted from light emitting element 122. Detecting element 124 is, e.g., a photodetector. The number of detecting elements 124 is not limited. In the present embodiment, the number of detecting elements 124 is one.

Optical receptacle 140 is disposed on substrate 121 of photoelectric conversion device 120. Optical receptacle 140, in a state of being disposed between photoelectric conversion device 120 and optical transmission member 150, optically connects light emitting surface 125 of light emitting element 122 or light receiving surface 126 of light receiving element 123 with end surface 151 of optical transmission member 150. A configuration of optical receptacle 140 will be described below in detail.

The type of optical transmission member 150 is not limited. Examples of optical transmission members 150 include an optical fiber and a light waveguide. In the present embodiment, optical transmission member 150 is one optical fiber. The optical fiber may be a single-mode optical fiber or a multi-mode optical fiber.

(Configuration of Optical Receptacle)

Figure 2A:
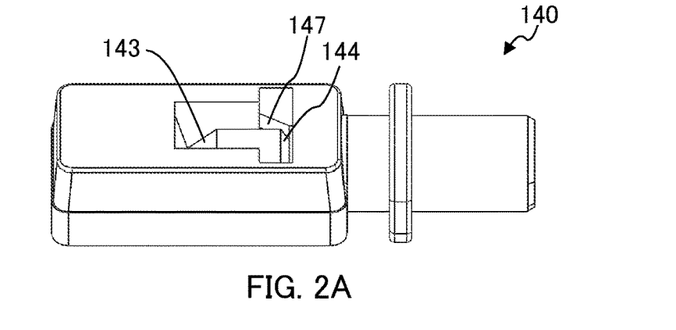
FIGS. 2A to 2D illustrate a configuration of an optical receptacle according to an embodiment of the present invention.
Figure 2B:
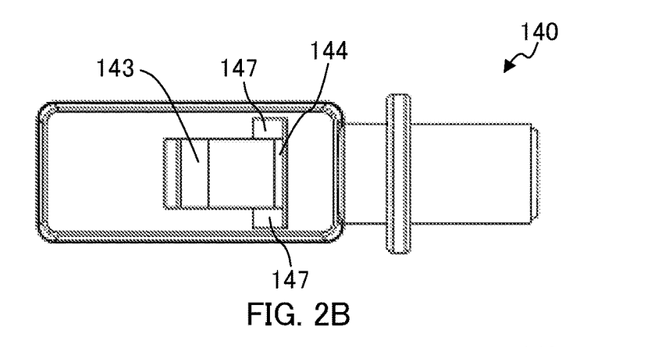
Figure 2C:
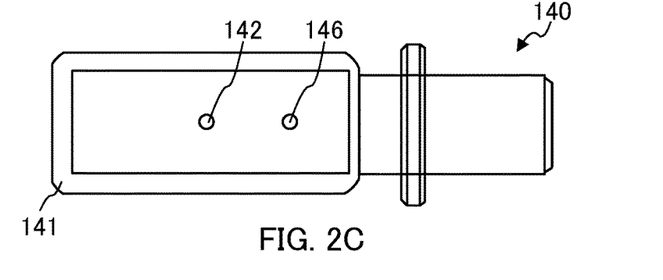
Figure 2D:
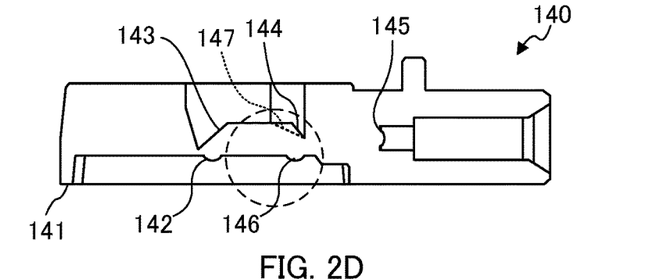

FIGS. 2A to 2D illustrate a configuration of optical receptacle 140 according to Embodiment 1. FIG. 2A is a perspective view, FIG. 2B is a plan view, FIG. 2C is a bottom view and FIG. 2D is a sectional view of optical receptacle 140. Hereinafter, optical receptacle 140 will be described with a surface thereof on the side where optical transmission member 150 is connected as the front surface, and a surface thereof facing photoelectric conversion device 120 as the bottom surface (rear surface).

As illustrated in FIG. 1A to FIG. 2D, optical receptacle 140 has a shape such that a substantially cuboid shaped member and a substantially cylindrical shaped member are joined. In optical module 100 for sending, optical receptacle 140 is configured to emit emission light L emitted from light emitting surface 125 of light emitting element 122 toward end surface 151 of optical transmission member 150. In optical module 100 for receiving, optical receptacle 140 is configured to emit reception light Lr from optical transmission member 150 toward light receiving surface 126 of light receiving element 123. Optical receptacle 140 includes installation flat surface 141, first optical surface 142, reflection surface 143, light separation part 144, second optical surface 145, third optical surface 146 and reference flat surface 147. Optical receptacle 140 is formed of a material that transmits light having a wavelength used for optical communications. Examples of such materials include transparent resins such as polyetherimide (PEI) and cyclic olefin resins. Optical receptacle 140 is produced by, e.g., injection molding.

Installation flat surface 141 is, when optical receptacle 140 is installed on substrate 121 of photoelectric conversion device 120, a surface (bottom surface) which contacts photoelectric conversion device 120 (substrate 121). As described below, installation flat surface 141 becomes a reference point (0°) for an inclination angle of an optical flat surface in optical receptacle 140 in the present embodiment. When optical receptacle 140 is installed on substrate 121 of photoelectric conversion device 120, installation flat surface 141 is parallel to the surface of substrate 121 and positioned along the optical axes of emission light L and reception light Lr between reflection surface 143 and second optical surface 145.

First optical surface 142 is an optical surface which is configured to allow emission light L emitted from light emitting element 122 to enter optical receptacle 140 therefrom, or configured to emit reception light Lr emitted from optical transmission member 150 toward light receiving element 123 from optical receptacle 140. In the present embodiment, first optical surface 142 has a shape of a convex lens protruding toward light emitting element 122. First optical surface 142 converts emission light L emitted from light emitting element 122 into collimate light. In the present embodiment, first optical surface 142 is disposed on the bottom surface of a recess provided on the rear side (installation flat surfaces 141) of optical receptacle 140 so as to face light emitting surface 125 of light emitting element 122 or light receiving surface 126 of light receiving element 123. The shape of first optical surface 142 in plan view is a circle. The central axis of first optical surface 142 is preferably perpendicular to light emitting surface 125 of light emitting element 122 or light receiving surface 126 of light receiving element 123. Further, the central axis of first optical surface 142 preferably coincides with the optical axis of light emitted from light emitting element 122 or light incident on light receiving element 123.

Reflection surface 143 is an optical surface (optical flat surface) configured to reflect light incident on first optical surface 142 toward (below-described) second optical surface 145, or to reflect light entering optical receptacle 140 from second optical surface 145 toward first optical surface 142. Reflection surface 143 is disposed on an optical path between first optical surface 142 and second optical surface 145. Reflection surface 143 is inclined so that the distance from optical transmission member 150 (front surface side) decreases from the bottom surface side to the top surface side of optical receptacle 140. In the present embodiment, the inclination angle of reflection surface 143 relative to installation flat surface 141 is 45°. Reflection surface 143 may be in any shape. In the present embodiment, the shape of reflection surface 143 is a flat surface. Light incident on first optical surface 142 or second optical surface 145 is incident on reflection surface 143 at an incident angle larger than the critical angle.

Light separation part 144 is configured to separate emission light (collimate light) L having a predetermined light flux diameter, which is incident on first optical surface 142, into monitor light Lm travelling toward detection element 124, and signal light Ls travelling toward second optical surface (and end surface 151 of optical transmission member 150). Light separation part 144 is an inclining surface relative to the optical axis of emission light L which is incident on first optical surface 142 and reflected on reflection surface 143. In the present embodiment, light separation part 144 is inclined so that the distance from optical transmission member 150 (front surface side) decreases from the top surface side to the bottom surface side of optical receptacle 140. This allows light separation part 144 to reflect a part of emission light L, which is incident on first optical surface 142 and reflected on reflection surfaces 143, toward third optical surface 146. The inclination angle of light separation part 144 relative to installation flat surface 141 is not limited. In the present embodiment, the inclination angle of light separation part 144 relative to installation flat surface 141 is 60°.

As illustrated in FIG. 1A, with respect to emission light L which enters optical receptacle 140 from first optical surface 142 and is reflected on reflection surface 143, a part of the light on the top surface side is incident on light separation part 144 at an incident angle larger than the critical angle. Light separation part 144 reflects the incident emission light L toward third optical surface 146 to generate monitor light Lm. On the other hand, a part of emission light L, the part being on the bottom surface side, propagates toward second optical surface 145 without being incident on light separation part 144, and becomes signal light Ls travelling toward end surface 151 of optical transmission member 150.

The light quantity ratio between signal light Ls and monitor light Lm is not limited as long as monitor light Lm sufficient for monitoring the intensity or quantity of emission light L emitted from light emitting element 122 can be obtained while a desired quantity of signal light Ls is obtained. The light quantity ratio (signal light Ls:monitor light Lm) is preferably 6:4, to 8:2, and more preferably 7:3. Adjustment of the quantity of emission light L incident on light separation part 144 can adjust the light quantity ratio between signal light Ls and monitor light Lm.

Second optical surface 145 is an optical surface which is configured to emit signal light Ls toward end surface 151 of optical transmission member 150, or to refract reception light Lr emitted from end surface 151 of optical transmission member 150 to allow the light to enter optical receptacle 140. In the present embodiment, second optical surfaces 145 is disposed on the front surface side of optical receptacle 140 so as to face end surface 151 of optical transmission member 150. Second optical surface 145 has a shape of a convex lens protruding toward the end surface of optical transmission member 150. This allows signal light Ls separated at light separation part 144 to be condensed and incident on end surface 151 of optical transmission member 150 in an efficient manner. This also allows reception light Lr emitted from optical transmission member 150 to converge and reach reflection surface 143 without propagation of the light being prevented at light separation part 144.

Third optical surface 146 is disposed on the bottom surface side of optical receptacle 140 so as to face detecting element 124. In the present embodiment, third optical surface 146 has a shape of a convex lens protruding toward detecting element 124. Third optical surface 146 is configured to allow monitor light Lm separated at light separation part 144 to converge, and configured to emit the light toward detecting element 124. This allows monitor light Lm to be incident on detecting element 124 in an efficient manner. The central axis of third optical surface 146 is preferably perpendicular to light receiving surface 126 of detecting element 124 (substrate 121).

Reference flat surface 147 is disposed at a position that is not on any optical path in optical receptacle 140. Relative to installation flat surface 141, the inclination angle of reference flat surface 147 is smaller than that of an optical flat surface (e.g., reflection surface 143 or light separation part 144), and the details will be described below. The angle of reference flat surface 147 relative to installation flat surface 141 is not limited as long as the angle falls within a range such that the angle therein can be measured with a measuring device using a laser probe with high accuracy. The inclination angle of reference flat surface 147 relative to installation flat surface 141 is, for example, 40° or smaller. In the present embodiment, the inclination angle of reference flat surface 147 relative to installation flat surface 141 is 30°.

The configuration of optical receptacle 140 has been described hereinabove. In the following, an optical path in optical module 100 is described.

As illustrated in FIG. 1A, in optical module 100 for sending, emission light L emitted from light emitting element 122 enters optical receptacle 140 from first optical surface 142. The entering light is converted into collimate light at first optical surface 142, and propagates toward reflection surface 143. The entering light is then reflected on reflection surface 143, and propagates toward light separation part 144. A part of the light flux which reaches light separation part 144 is reflected on light separation part 144, a reflection surface, and emitted outside optical receptacle 140 from third optical surface 146 to reach detecting element 124 as monitor light Lm. The rest of the light flux, which does not reach light separation part 144, (light which is not reflected on light separation part 144) reaches end surface 151 of optical transmission member 150 as signal light Ls. Signal light Ls is condensed at second optical surface 145 to the center of end surface 151 of optical transmission member 150.

As illustrated in FIG. 1B, in optical module 100 for receiving, reception light Lr emitted from end surface 151 of optical transmission member 150 enters optical receptacle 140 from second optical surface 145. Reception light Lr (entering light) is condensed at second optical surface 145, and the light flux diameter thereof becomes small as the distance from light separation part 144 decreases. This allows reception light Lr to reach reflection surface 143 without propagation of the light being prevented at light separation part 144. The light flux diameter of reception light Lr then becomes large as the distance from reflection surface 143 decreases. The light reflected on reflection surface 143 is emitted outside optical receptacle 140 from first optical surface 142 to reach light receiving element 123. Reception light Lr (emission light) is condensed at first optical surface 142 to the center of light receiving surface 126 of light receiving element 123.

(Measurement of Inclination Angle of Optical Flat Surface)

In the following, described is a method for measuring an inclination angle of an optical flat surface relative to installation flat surface 141 in optical receptacle 140 according to the present embodiment. In the present embodiment, the inclination angle (designed angle: 60°) of light separation part 144, as an optical flat surface, relative to installation flat surface 141 is measured. In the measuring method according to the present embodiment, a measuring device for measuring in a noncontact manner using a laser probe is used. In the following, measurement accuracy of the measuring device is described, and then the measuring method is described.

(1) Measurement Accuracy of Measuring Device

With respect to a measuring device for measurement of an inclination angle of an optical flat surface in an optical receptacle, the relationship between inclination angles of an optical flat surface and measurement accuracy of the measuring device was examined. In this experiment, the measurement was performed in the case where the inclination angle of the optical flat surface relative to the installation flat surface is 35°, 40°, 45°, 46°, 47°, 48° or 49°. An optical receptacle including an optical flat surface whose inclination angle relative to the installation flat surface is 45° is used. For the measurement in the case where the inclination angle of the optical flat surface relative to the installation flat surface is other than 45°, the optical receptacle was rotated using a stage capable of angle adjustment with high accuracy so that the inclination angle of the optical flat surface became 35°, 40°, 46°, 47°, 48° or 49° relative to the installation flat surface at the original position (position before the rotation). The inclination angles of the optical flat surface were measured with the inclination angle of the installation flat surface at the original position (position before the rotation) as a reference point (0°). The optical receptacle was produced from polyetherimide (PEI) as the material by injection molding. The inclination angle of the optical flat surface relative to the installation flat surface was measured using a laser focus 3D measuring instrument (NH-3: manufactured by Mitaka Kohki Co., Ltd.) by a point autofocus method (ISO 25178-605: 2014). A three-dimensional shape of the optical flat surface was measured with the diameter of the measuring range of 0.8 mm and the number of data of 800, and the inclination angle of the optical flat surface relative to the installation flat surface was determined on the basis of the shape. The above measurement was performed five times for each inclination angle.

Figure 3:
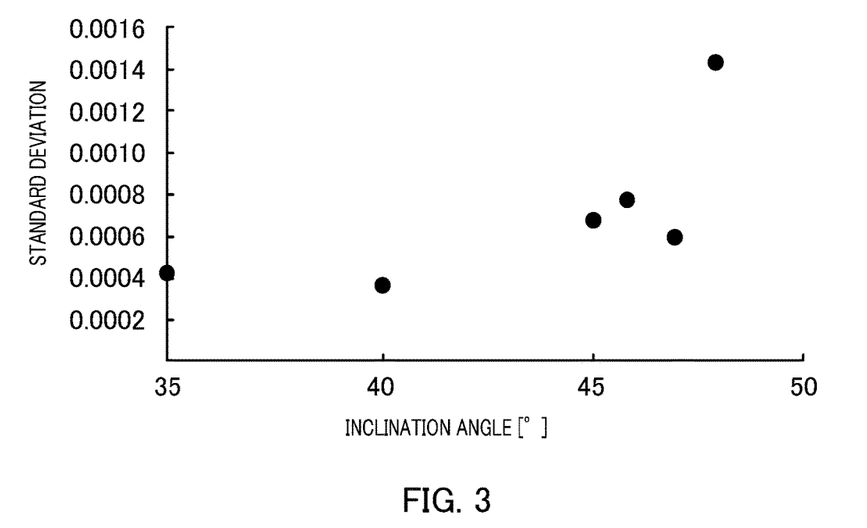
FIG. 3 is a graph showing a relationship between inclination angles of an optical flat surface and standard deviation within a measuring device.

FIG. 3 is a graph showing the relationship between the inclination angles of the optical flat surface and standard deviation of the measuring results. In FIG. 3, the abscissa represents the inclination angle)(° of the optical flat surface relative to the installation flat surface, and ordinate represents the standard deviation of the five-time measuring results. For the optical flat surface with the inclination angle of 49°, the measurement was not possible due to the measuring limit of the device, and thus no measuring result is shown. These results show that when the inclination angle becomes more than 40°, the standard deviation of the measuring results increases and the measurement accuracy of the measuring device decreases. It was also shown that the limit of the inclination angle which can be measured is 48°. Accordingly, from the perspective of measuring with high accuracy, an inclination angle of an optical flat surface relative to an installation flat surface is preferably 40° or smaller.

In optical receptacle 140 according to the present embodiment, the inclination angle of reflection surface 143 is 45° and the inclination angle of light separation part 144 is 60° each relative to installation flat surface 141. Therefore, it is difficult to measure, with high accuracy, the inclination angles of reflection surface 143 and light separation part 144 relative to installation flat surface 141 using the measuring device.

(2) Measuring Method of Inclination Angle of Optical Flat Surface

Figure 4:
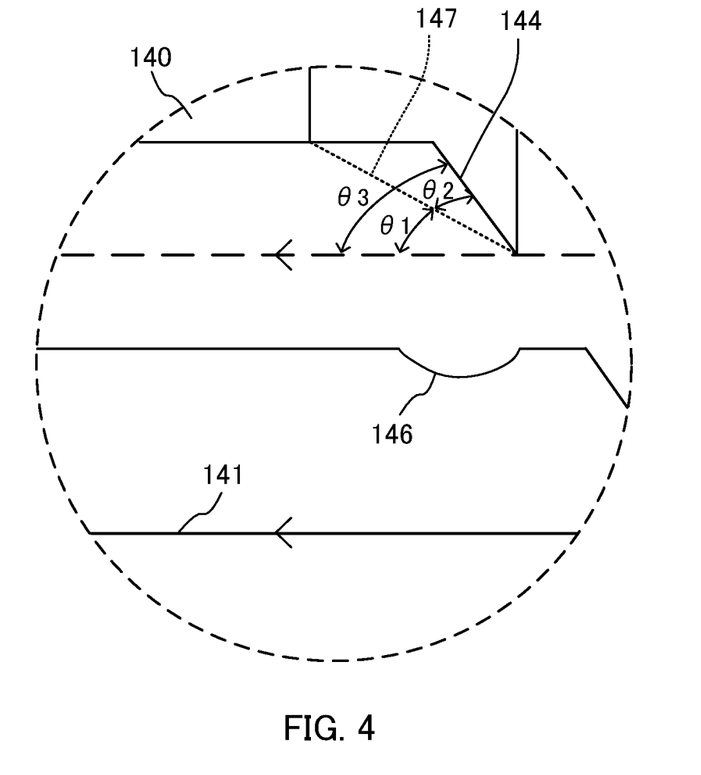
FIG. 4 is a partially enlarged schematic view for describing a method for measuring an inclination angle of an optical flat surface.

In the following, described is a method for measuring an inclination angle of an optical flat surface according to the present embodiment. FIG. 4 is a partially enlarged schematic view for describing a method for measuring an inclination angle of an optical flat surface, and of the region illustrated with a broken line in FIG. 2D. In FIG. 4, a broken line represents a parallel line extending along installation flat surface 141. Therefore, the inclination angle relative to installation flat surface 141 is the same as the inclination angle relative to the parallel line. In the method for measuring an inclination angle of an optical flat surface according to the present embodiment, an inclination angle of an optical flat surface (light separation part 144) relative to installation flat surface 141 is measured in two processes.

Firstly, optical receptacle 140 is provided and installed in the measuring device. Optical receptacle 140 is installed so that the inclination angles of installation flat surface 141 and reference flat surface 147 fall within an angle range such that the inclination angles therein can be measured using the measuring device with high accuracy (for example, the range of −40° to +40° relative to the reference surface (0°) in the device).

First inclination angle θ1 that is the inclination angle of reference flat surface 147 relative to installation flat surface 141 is then measured. Specifically, first inclination angle θ1 is determined using the measuring device by measuring the inclination angles of installation flat surface 141 and reference flat surface 147 relative to the reference surface in the device, followed by calculating a differential value between these inclination angles.

Subsequently, optical receptacle 140 and the optical axis of laser light emitted from the laser probe are relatively rotated. Optical receptacle 140 is rotated so that the inclination angles of reference flat surface 147 and light separation part 144 fall within an angle range such that the inclination angles therein can be measured using the measuring device with high accuracy (for example, the range of −40° to +40° relative to the reference surface (0°) in the device).

Second inclination angle θ2 that is the inclination angle of light separation part 144 relative to reference flat surface 147 is then measured. Specifically, second inclination angle θ2 is determined using the measuring device by measuring the inclination angles of reference flat surface 147 and light separation part 144 relative to the reference surface in the device, followed by calculating a differential value between these inclination angles.

Finally, third inclination angle θ3 that is the inclination angle of light separation part 144 relative to installation flat surface 141 is calculated by adding measured first inclination angle θ1 and second inclination angle θ2.

As described above, the inclination angle (third inclination angle θ3) of light separation part 144 relative to installation flat surface 141 in optical receptacle 140 according to the present embodiment is 60° and larger than the measuring limit of the above measuring device. However, both the inclination angle (first inclination angle θ1) of reference flat surface 147 relative to installation flat surface 141 and the inclination angle (second inclination angle θ2) of light separation part 144 relative to reference flat surface 147 are 30° and fall within the range such that the angles therein can be measured using the above measuring device with high accuracy. The procedure described above makes it possible to measure, with high accuracy, the inclination angle of light separation part 144 relative to installation flat surface 141 in optical receptacle 140 even when the inclination angle is larger than the measuring limit of the measuring device.

(Effects)

As described above, in the measuring method according to the present embodiment, the inclination angle of reference flat surface 147 relative to installation flat surface 141 is measured, and then an inclination angle of an optical flat surface is measured with this reference flat surface 147 as a reference surface. An inclination angle of an optical flat surface is measured in more than one process which are each carried out within an angle range where measurement can be performed with high accuracy. As a result, an inclination angle of an optical flat surface can be measured with high accuracy even when the inclination angle cannot be appropriately measured in one process using a measuring device with a laser probe.

Further, reference flat surface 147, a reference surface for an inclination angle, can be formed integrally with optical receptacle 140, and therefore, the inclination angle of an optical flat surface can be simply measured with high accuracy.

In the measuring method according to the present embodiment, an inclination angle of an optical flat surface is measured in two processes; however, the measurement may be performed in three or more processes in the measuring method according to the present invention.

In the measuring method according to the present embodiment, the inclination angle is measured for light separation part 144 as an optical flat surface; however, the optical flat surface to be measured is not limited to light separation part 144 in the measuring method according to the present invention. The optical flat surface to be measured may be any optical flat surface which is disposed on an optical path between first optical surface 142 and second optical surface 145 and inclined at an angle larger than 40° relative to installation flat surface 141, and which transmits or reflects at least a part of light incident on first optical surface 142 toward second optical surface 145, or transmits or reflects at least a part of light incident on second optical surface 145 toward first optical surface 142. For example, the inclination angle of reflection surface 143 relative to installation flat surface 141 may be measured.

In the present embodiment, optical receptacle 140 including two reference flat surfaces 147 is described, but the number of reference flat surfaces 147 is not limited thereto. The number of reference flat surfaces 147 may be one, or three or more. From the perspective of measuring an inclination angle with high accuracy, reference flat surface 147 and an optical flat surface are preferably adjacent to each other when measuring the inclination angle.

(Modifications)

In the present embodiment, as illustrated in FIG. 2A, optical receptacle 140 in which two reference flat surfaces 147 are disposed adjacent to both sides of light separation part 144 is described, but the position of the reference flat surface is not limited thereto. FIGS. 5A to 5C and 6A to 6D are perspective views illustrating configurations of optical receptacles 140a to 140g according to modifications.

Figure 5A:
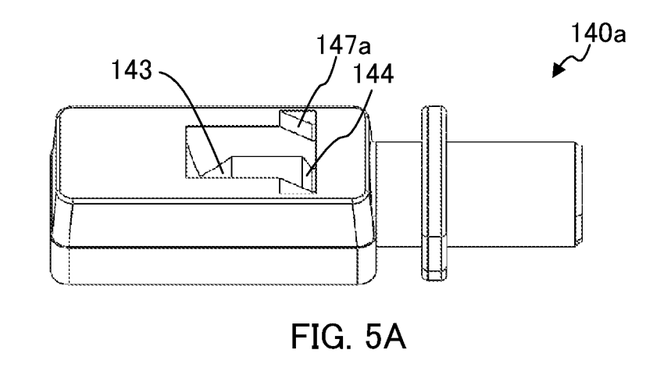
FIGS. 5A to 5C are perspective views illustrating configurations of optical receptacles according to modifications.
Figure 5B:
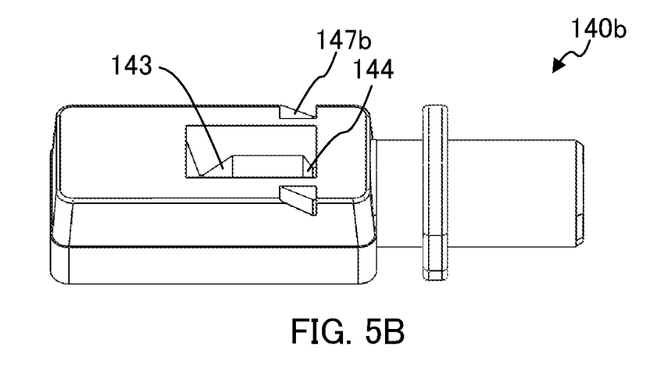
Figure 5C:
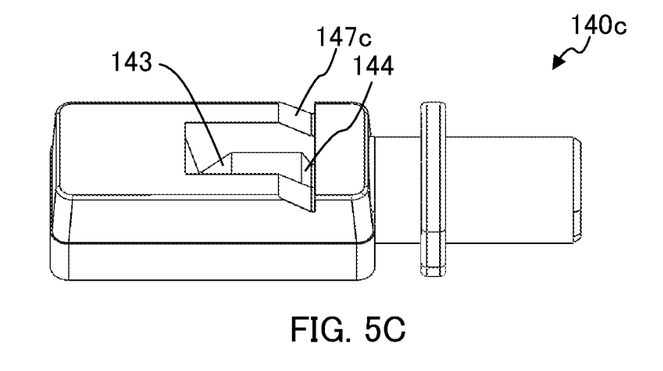

As illustrated in FIGS. 5A to 5C, each of reference flat surfaces 147a to 147c may be disposed closer to the top surface side of optical receptacle 140a than light separation part 144a to 144c is. In these cases, a recess including one of reference flat surfaces 147a to 147c may open at a recess including light separation part 144 (FIG. 5A), at the side surface (FIG. 5B) or at both the recess and the side surface (FIG. 5C).

Figure 6A:
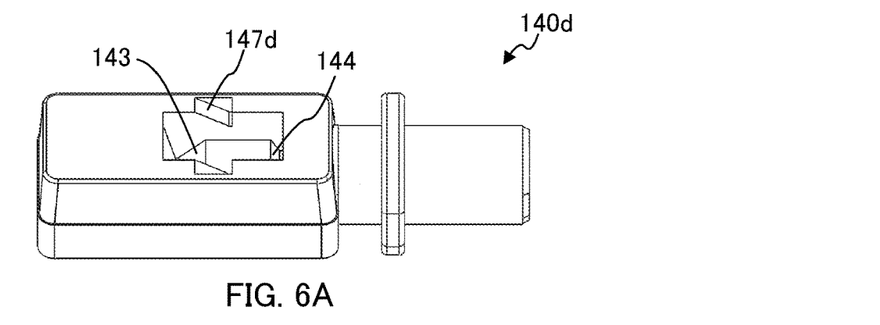
FIGS. 6A to 6D are perspective views illustrating configurations of optical receptacles according to modifications.
Figure 6B:
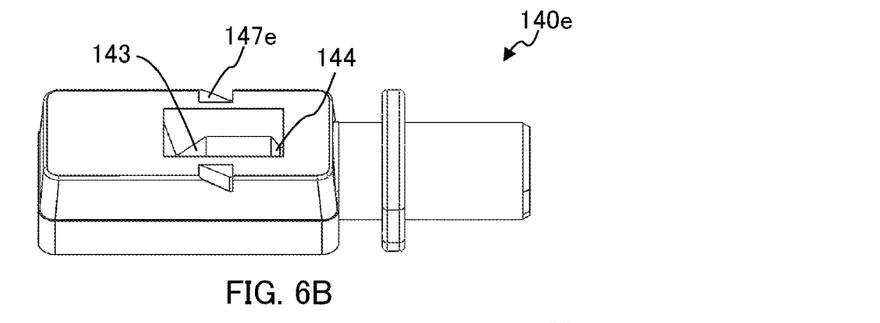
Figure 6C:
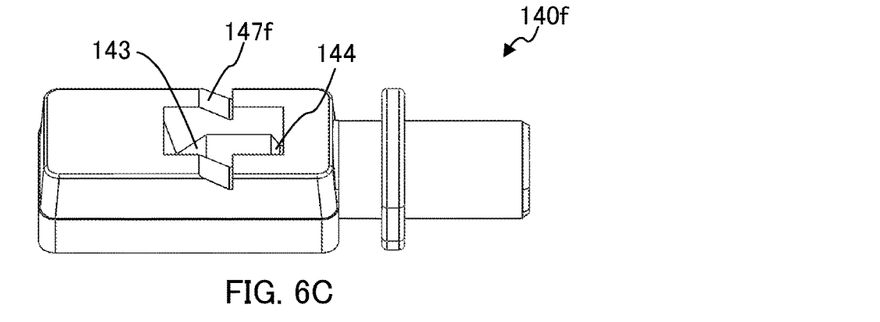
Figure 6D:
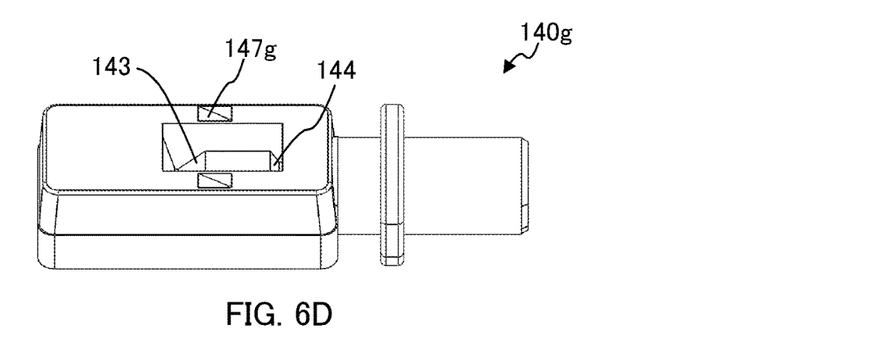

As illustrated in FIGS. 6A to 6D, each of reference flat surfaces 147d to 147g may be disposed closer to the back surface side of optical receptacle 140d to 140g than light separation part 144 is. In these cases, a recess including one of reference flat surfaces 147d to 147g may open at a recess including light separation part 144 (FIG. 6A), at the side surface (FIG. 6B), at both the recess and the side surface (FIG. 6C) or at neither the recess nor the side surface (FIG. 6D).

Further, in the present embodiment, optical receptacle 140 is described, in which light emitting surface 125 of one light emitting element 122 or light receiving surface 126 of one light receiving element 123 is optically connected to end surface 151 of one optical transmission member 150, but optical receptacle 140 according to the present invention is not limited to such a mode. As illustrated in FIGS. 7A to 7D, FIGS. 8A to 8E, FIGS. 9A to 9C and FIGS. 10A to 10D, for example, light emitting surfaces of a plurality of light emitting elements or light receiving surfaces of a plurality of light receiving element may be optically connected to respective end surfaces of a plurality of optical transmission members in an optical receptacle according to the present invention.

In each of optical receptacles 140h to 140w (also referred to as a lens array) in which a plurality of photoelectric conversion elements is optically connected to respective end surfaces of a plurality of optical transmission members, although not illustrated, a plurality of first optical surfaces 142 and a plurality of second optical surfaces 145 are each disposed, in one line along the long side direction, on the bottom surface of a recess provided on the rear side of each of optical receptacles 140h to 140w, and a plurality of third optical surfaces 146 is disposed, in one line along the long side direction, on the bottom surface of a recess provided on front surface side of each of optical receptacles 140h to 140w. Accordingly, the areas of reflection surface 143' and light separation part 144' in each of optical receptacles 140h to 140W are larger than those of reflection surface 143 and light separation part 144 in optical receptacle 140 according to the present embodiment. A light separation part in an optical receptacle may be a configuration such as a reflecting/transmitting part of a lens array (optical receptacle) described in Japanese Patent Application Laid-Open No. 2012-194372. In such an optical receptacle in which a plurality of photoelectric conversion elements is optically connect to a plurality of respective optical transmission members, the position of the reference flat surface is not limited, either. FIGS. 7A to 7D, 8A to 8E, 9A to 9C and 10A to 10D are perspective views illustrating configurations of optical receptacles 140h to 140w according to modifications.

Figure 7A:
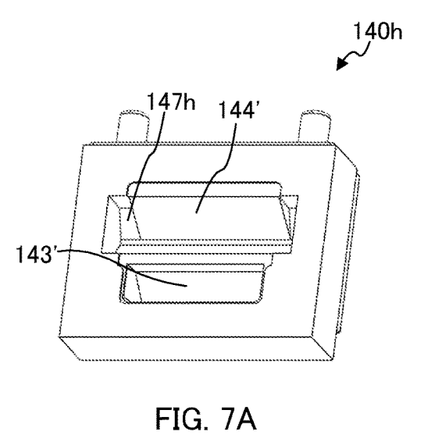
FIGS. 7A to 7D are perspective views illustrating configurations of optical receptacles according to modifications.
Figure 7B:
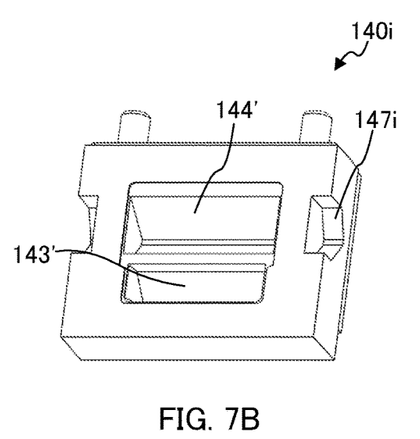
Figure 7C:
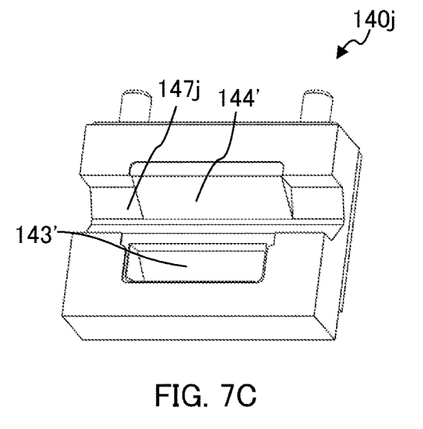
Figure 7D:
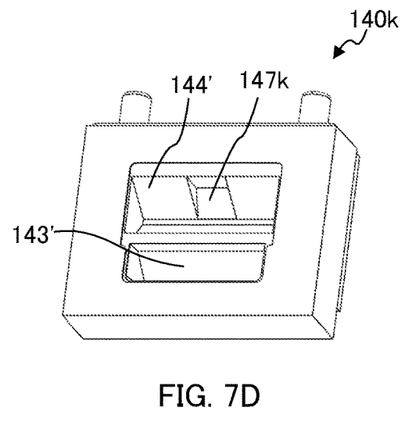

As illustrated in FIGS. 7A to 7D, each of reference flat surfaces 147h to 147k may be disposed in the vicinity of light separation part 144'. In these cases, at both sides of a recess including light separation part 144', a recess including one of reference flat surfaces 147h to 147k may open at the recess including light separation part 144' (FIG. 7A), at the side surface (FIG. 7B) or at both the recess and the side surface (FIG. 7C), or may be disposed inside the recess including light separation part 144' (FIG. 7D).

Figure 8A:
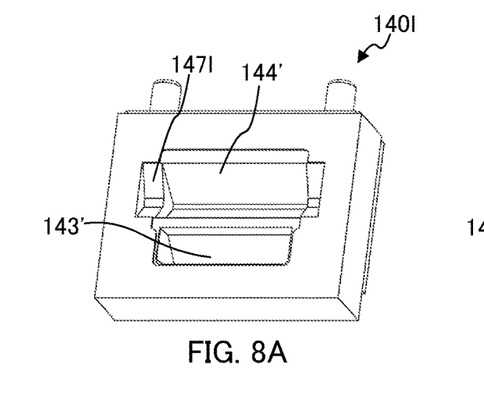
FIGS. 8A to 8E are perspective views illustrating configurations of optical receptacles according to modifications.
Figure 8B:
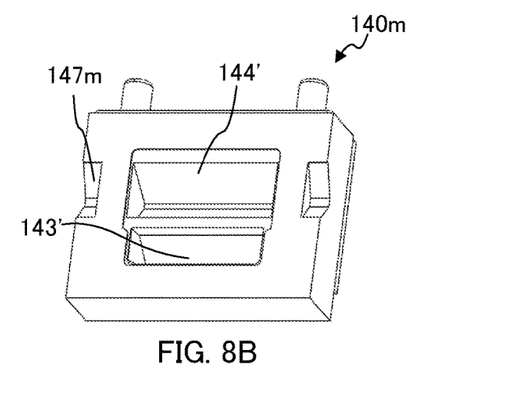
Figure 8C:
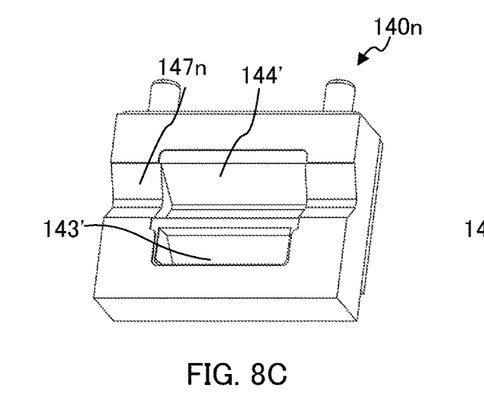
Figure 8D:
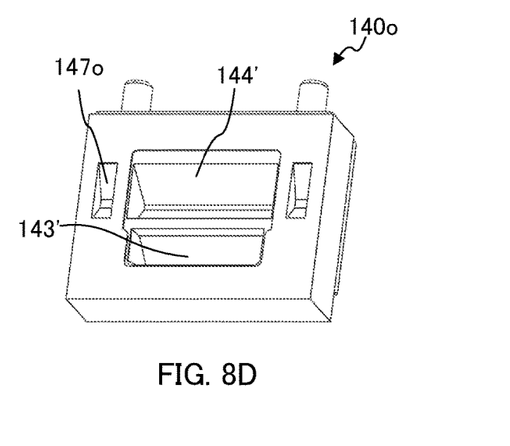
Figure 8E:
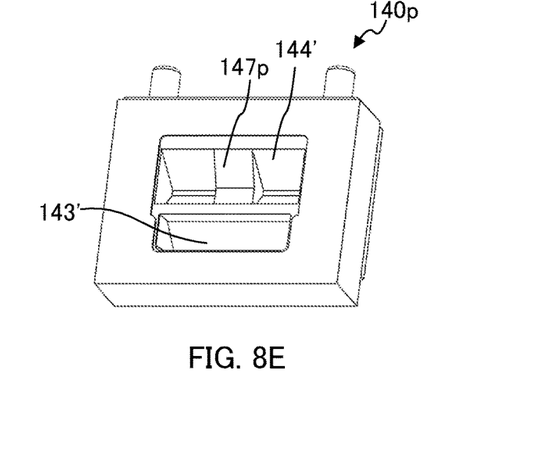

As illustrated in FIGS. 8A to 8E, each of reference flat surfaces 147l to 147p may be disposed closer to the top surface side of optical receptacle 140l to 140p than light separation part 144' is. In these cases, at both sides of a recess including light separation part 144', a recess including one of reference flat surfaces 147l to 147p may open at the recess including light separation part 144' (FIG. 8A), at the side surface (FIG. 8B), or at both the recess and the side surface (FIG. 8C) or at neither the recess nor the side surface (FIG. 8D), or may be disposed inside the recess including light separation part 144' (FIG. 8E).

Figure 9A:
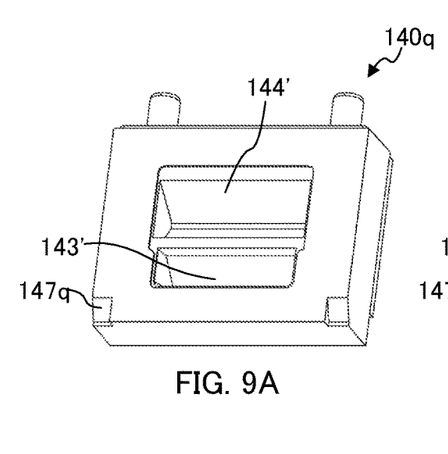
FIGS. 9A to 9C are perspective views illustrating configurations of optical receptacles according to modifications.
Figure 9B:
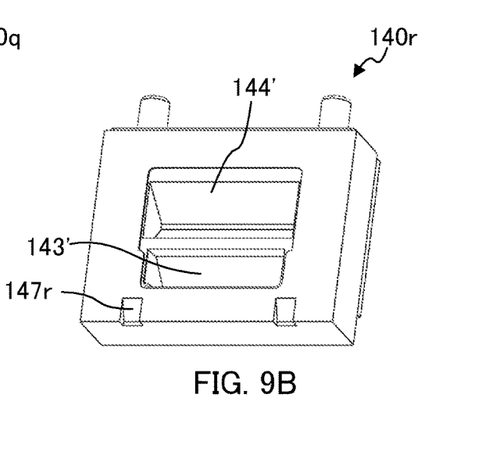
Figure 9C:
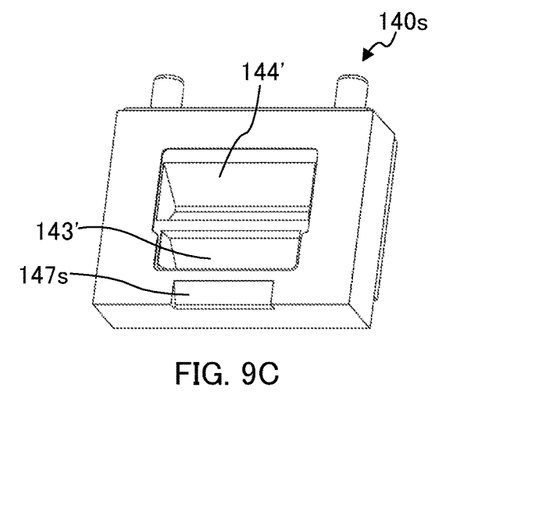

As illustrated in FIGS. 9A to 9C, each of reference flat surfaces 147q to 147s may be disposed closer to the back surface side of optical receptacle 140q to 140s than light separation part 144' is. In these cases, a recess including one of reference flat surfaces 147q to 147s may open at both side surface and back surface (FIG. 9A) or only at the back surface (FIGS. 9B and 9C). As illustrated in FIG. 9C, the number of reference flat surfaces 147s may be one.

Figure 10A:
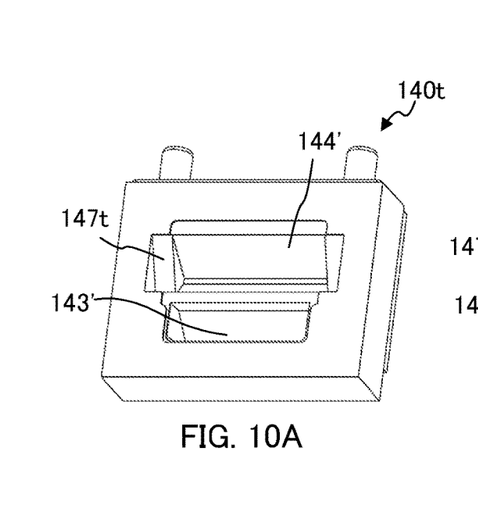
FIGS. 10A to 10D are perspective views illustrating configurations of optical receptacles according to modifications.
Figure 10B:
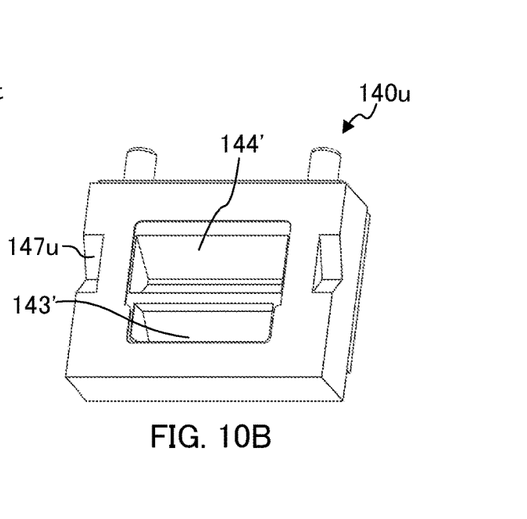
Figure 10C:
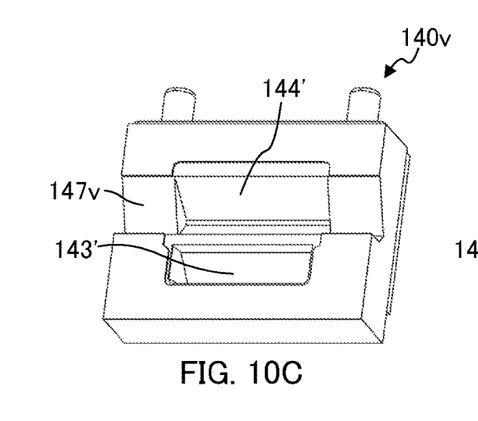
Figure 10D:
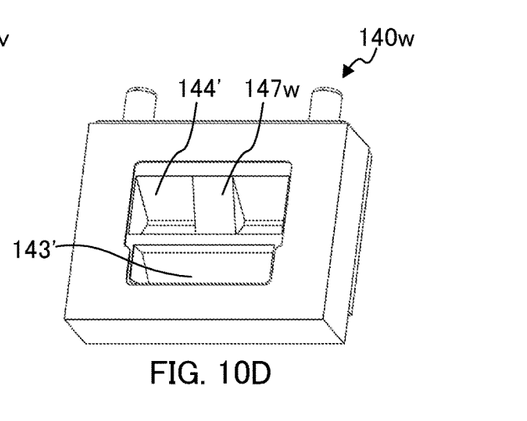

As illustrated in FIGS. 10A to 10D, it is not necessary for a recess including one of reference flat surfaces 147t to 147w to include a bottom surface parallel to installation flat surface 141. In these cases, at both sides of a recess including light separation part 144', a recess including one of reference flat surfaces 147t to 147w may open at the recess including light separation part 144' (FIG. 10A), at the side surface (FIG. 10B) or at both the recess and the side surface (FIG. 10C), or may be disposed inside the recess including light separation part 144' (FIG. 10D).

This application claims priority based on Japanese patent Application No. 2014-263393, filed on Dec. 25, 2014, the entire contents of which including the specification and the drawings are incorporated herein by reference.

INDUSTRIAL APPLICABILITY

The measuring method according to the present invention is particularly advantageous for, e.g., quality control during production of optical receptacles.

REFERENCE SIGN LIST

100 Optical Module
120 Photoelectric Conversion Device

121 Substrate
122 Light Emitting Element
123 Light Receiving Element
124 Detecting Element
125 Light Emitting Surface
126 Light Receiving Surface
140, 140a to 140w Optical Receptacle
141 Installation Flat Surface
142 First Optical Surface
143, 143' Reflection Surface
144, 144' Light Separation Part
145 Second Optical Surface
146 Third Optical Surface
147, 147a to 147w Reference Flat Surface
150 Optical Transmission Member
151 End Surface
152 Ferrule
L Emission Light
Lm Monitor Light
Ls Signal Light
Lr Reception Light
θ1 First Inclination Angle
θ2 Second Inclination Angle
θ3 Third Inclination Angle

The invention claimed is:

1. A method for measuring an inclination angle of an optical flat surface relative to an installation flat surface in an optical receptacle in a noncontact manner using a laser probe, the method comprising:

provising an optical receptacle which includes an installation flat surface, an optical flat surface and a reference flat surface having an inclination angle relative to the installation flat surface, the inclination angle being smaller than an inclination angle of the optical flat surface relative to the installation flat surface;

measuring a first inclination angle that is the inclination angle of the reference flat surface relative to the installation flat surface;

measuring a second inclination angle that is an inclination angle of the optical flat surface relative to the reference flat surface; and calculating a third inclination angle that is the inclination angle of the optical flat surface relative to the installation flat surface, by adding the first inclination angle and the second inclination angle.

2. The method according to claim 1, further comprising relatively rotating the optical receptacle and an optical axis of laser light emitted from the laser probe, the rotating being performed between the measuring of the first inclination angle and the measuring of the second inclination angle.

3. The method according to claim 1, wherein the third inclination angle is larger than 40°.

4. The method according to claim 3, wherein the third inclination angle is larger than 48°.

5. The method according to claim 1, wherein the first inclination angle and the second inclination angle are both 40° or smaller.

* * * * *